(12) United States Patent
Chen et al.

(10) Patent No.: US 7,432,739 B2
(45) Date of Patent: Oct. 7, 2008

(54) LOW VOLTAGE COMPLEMENTARY METAL OXIDE SEMICONDUCTOR PROCESS TRI-STATE BUFFER

(75) Inventors: Tzung-Shen Chen, Guishan Shiang (TW); Ti-Wen Chen, Tainan (TW); Chun-Yu Liao, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/588,217

(22) Filed: Oct. 27, 2006

(65) Prior Publication Data

US 2008/0100340 A1     May 1, 2008

(51) Int. Cl.
    H03K 19/00    (2006.01)
    H03K 19/02    (2006.01)

(52) U.S. Cl. .......................... 326/56; 326/58
(58) Field of Classification Search .............. 326/56–58
    See application file for complete search history.

(56) References Cited

U.S. PATENT DOCUMENTS

| | | | | |
|---|---|---|---|---|
| 5,396,128 A | * | 3/1995 | Dunning et al. | 326/68 |
| 5,576,635 A | * | 11/1996 | Partovi et al. | 326/27 |
| 5,929,654 A | * | 7/1999 | Park et al. | 326/58 |
| 6,225,824 B1 | * | 5/2001 | Madhu et al. | 326/58 |
| 6,236,236 B1 | * | 5/2001 | Chen | 326/81 |
| 6,320,415 B1 | * | 11/2001 | Lee | 326/81 |
| 7,239,177 B2 | * | 7/2007 | Bansal | 326/80 |
| 2002/0021144 A1 | * | 2/2002 | Morgan et al. | 326/57 |
| 2005/0104622 A1 | * | 5/2005 | Chen et al. | 326/57 |

* cited by examiner

*Primary Examiner*—Rexford Barnie
*Assistant Examiner*—Jason M Crawford
(74) *Attorney, Agent, or Firm*—Rabin & Berdo, P.C.

(57) ABSTRACT

A low voltage complementary metal oxide semiconductor (CMOS) process tri-state buffer includes a logic device, a biasing device and a switch device. The logic device receives an input signal and an enable signal and generates a first control signal and a second control signal. The biasing device receives the first control signal and thus controls a voltage level of a third control signal. The switch device receives the second and third control signals and respectively couples an output terminal to a first external voltage source and a second external voltage source when the second and third control signals are enabled. When the enable signal is disabled, the second and third control signals are simultaneously disabled so that the output terminal is floating with respect to the first and second external voltage sources and the output terminal is held in a high impedance state.

9 Claims, 4 Drawing Sheets

LOW VOLTAGE COMPLEMENTARY METAL OXIDE SEMICONDUCTOR PROCESS TRI-STATE BUFFER

BACKGROUND OF THE INVENTION

1. Field of the Invention

The invention relates in general to a low voltage CMOS (Complementary Metal Oxide Semiconductor) process buffer, and more particularly to a CMOS process tri-state buffer.

2. Description of the Related Art

FIG. 1 is a circuit diagram showing a conventional low voltage CMOS process buffer. The buffer 100 includes a biasing device 102 and a switch device 104. The biasing device 102 receives an input signal Vin and controls control signals VG5 and VG6 of transistors T5 and T6 according to the input signal Vin. The biasing device 102 further biases the control signal VG5 to a specific voltage level through transistors T1 to T4, when the input signal Vin has a high voltage level, to make a crossover voltage of a gate oxide layer of the transistor T5 be smaller than a crossover voltage of a gate oxide layer of a low voltage CMOS process transistor. The transistors T5 and T6 bias the voltage level of an output terminal 104a to the voltage levels of a voltage Vo1 and a grounding voltage according to the control signals VG5 and VG6, respectively, and the voltage of the output terminal 104a serves as an output signal Vout. The voltage Vo1 may have, for example, the highest voltage level of the buffer 100. However, the buffer 100 has several drawbacks.

The output terminal 104a of the buffer 100 only has two states including a high voltage level state and a grounding voltage level state. That is, one of the transistors T5 and T6 is driven to turn on and continuously generate a DC current at any time instant. Consequently, the buffer 100 continuously generates the current and thus becomes more power-consumptive. In addition, when the control signal VG5 is to be biased from the highest voltage level to the low voltage level by way of discharge, the dimensions of the transistors T3 and T4 are restricted, and the discharge current for discharging the control signal VG5 is thus restricted because the transistors T3 and T4 on the discharge path have to bias the control signal VG5 together with the transistor T1. Consequently, the voltage level falling time of the control signal VG5 becomes longer such that the switch device 104 tends to generate the malfunction.

SUMMARY OF THE INVENTION

It is therefore an object of the invention to provide a low voltage CMOS (Complementary Metal Oxide Semiconductors) process tri-state buffer capable of effectively solving the following conventional problems including: the buffer is more power-consumptive because an output terminal has no high impedance state; and the too long control signal falling time causes the malfunction because a biasing device only has one discharge path.

The invention achieves the above-identified objects by providing a low voltage CMOS (Complementary Metal Oxide Semiconductor) process tri-state buffer applied to a low voltage process integrated circuit. The low voltage CMOS process tri-state buffer includes a logic device, a biasing device and a switch device. The logic device includes a first logic unit, a second logic unit and a third logic unit. The first logic unit receives an enable signal and performs a NOT logic operation according to the enable signal to generate a reverse enable signal. The second logic unit receives an input signal and the enable signal and performs an AND logic operation according to the input signal and the enable signal to generate a first control signal. The third logic unit receives the input signal and the reverse enable signal and performs a NOR logic operation according to the input signal and the reverse enable signal to generate a second control signal. The biasing device receives the first control signal, controls the voltage level of a third control signal according to the first control signal, and outputs the third control signal. The switch device receives the second and third control signals and respectively couples an output terminal to a first external voltage source and a second external voltage source when the second and third control signals are enabled to make the voltage level of the output terminal be equal to the voltage levels of the first and second external voltage sources. When the enable signal is disabled, the second and third control signals are simultaneously disabled such that the output terminal is floating with respect to the first and second external voltage sources and the output terminal is held in a high impedance state.

Other objects, features, and advantages of the invention will become apparent from the following detailed description of the preferred but non-limiting embodiments. The following description is made with reference to the accompanying drawings.

DETAILED DESCRIPTION OF THE INVENTION

A low voltage CMOS (Complementary Metal Oxide Semiconductor) process tri-state buffer includes a logic device, a biasing device and a switch device. The logic device receives an input signal and an enable signal to generate a first control signal and a second control signal. The biasing device receives the first control signal to control a voltage level of a third control signal. The switch device receives the second and third control signals and couples an output terminal to a first external voltage source and a second external voltage source when the second and third control signals are enabled. When the enable signal is disabled, the second and third control signals are disabled simultaneously such that the output terminal is floating relative to the first and second external voltage sources and the output terminal is held in a high impedance state.

Figure 1:
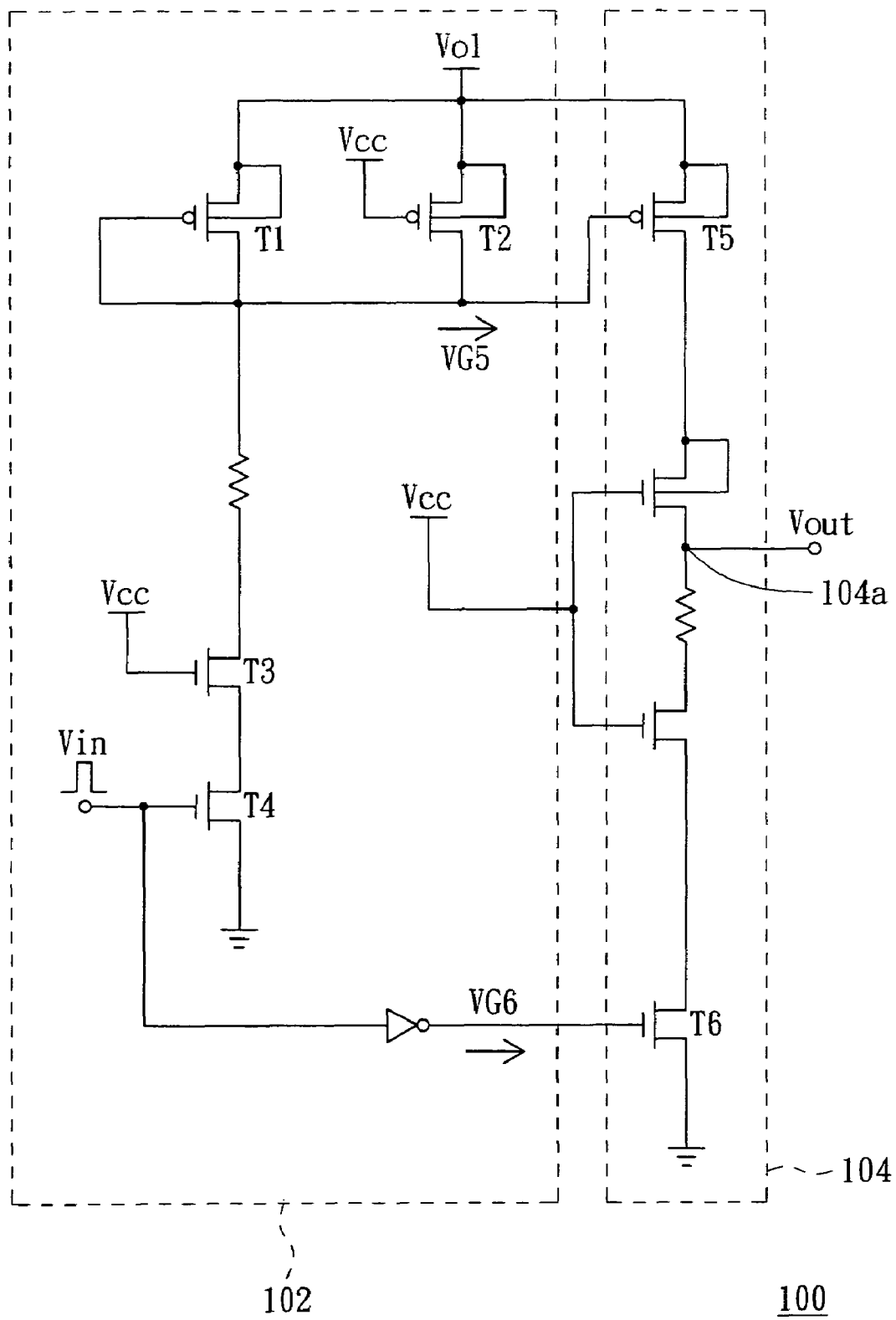
FIG. 1 (PriorArt) is a circuit diagram showing a conventional low voltage CMOS process buffer.
Figure 2:
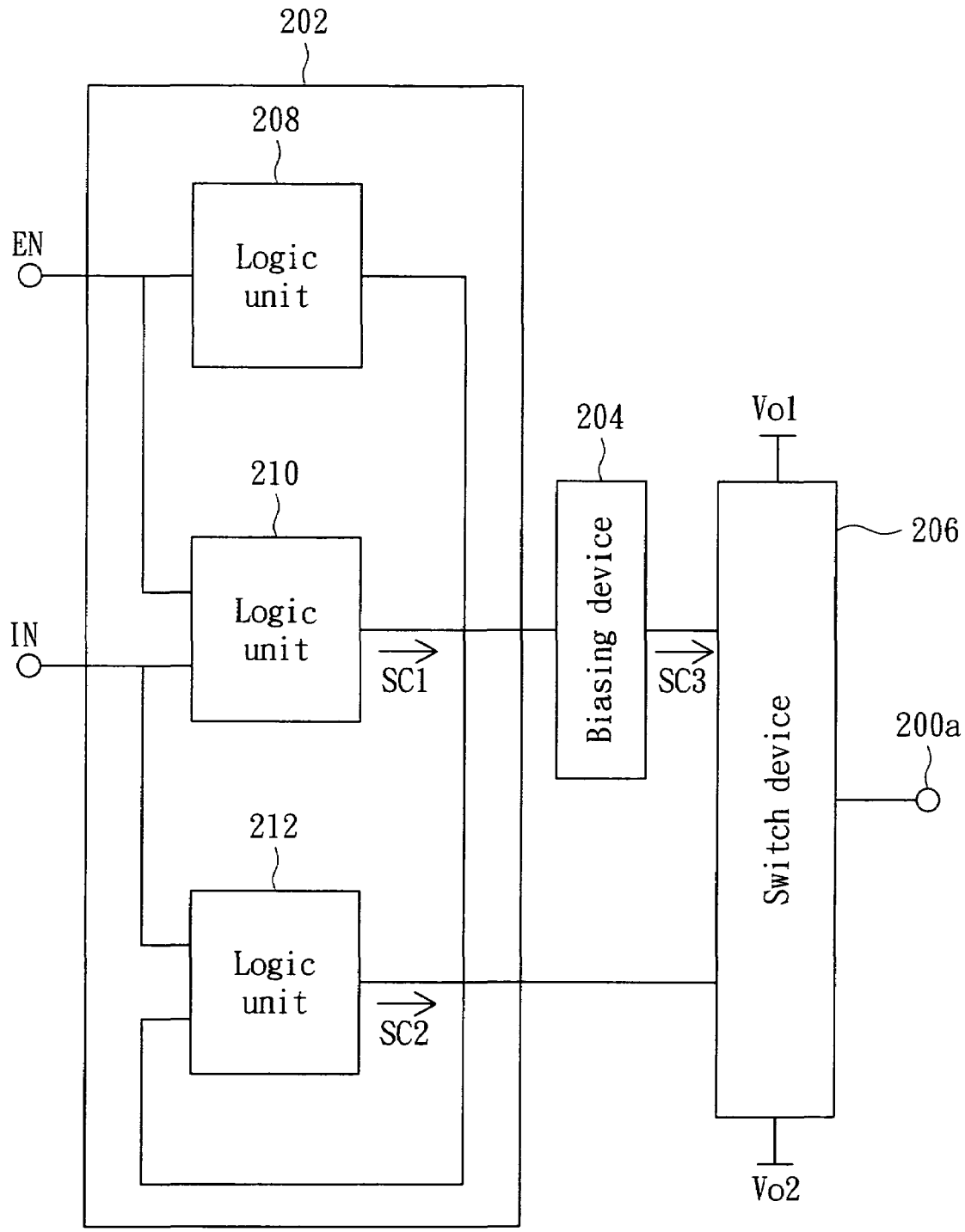
FIG. 2 is a block diagram showing a low voltage CMOS process tri-state buffer according to an embodiment of the invention.

FIG. 2 is a block diagram showing a low voltage CMOS process tri-state buffer 200 according to an embodiment of the invention. Referring to FIG. 2, the buffer 200 includes a logic device 202, a biasing device 204 and a switch device 206. The logic device 202 includes logic units 208, 210 and 212. The logic unit 208 receives an enable signal EN and performs a NOT logic operation according to the enable signal to generate a reverse enable signal ENB. The logic unit 210 receives an input signal IN and the enable signal EN and performs an AND logic operation according to the input signal IN and the enable signal EN to generate a control signal SC1. The logic unit 212 receives the input signal IN and the reverse enable signal ENB and performs a NOR logic operation according to the input signal IN and the reverse enable signal ENB to generate a control signal SC2.

The biasing device 204 receives the control signal SC1 and controls a voltage level of a control signal SC3 according to the control signal SC1. The biasing device 204 further outputs the control signal SC3. The switch device receives the control signals SC2 and SC3 and couples an output terminal 200a of the buffer 200 to external voltage sources Vo1 and Vo2 when the control signals SC2 and SC3 are enabled, respectively, to make the voltage level of the output terminal 200a be equal to the voltage levels of the external voltage sources Vo1 and Vo2.

In this embodiment, the voltage level of the external voltage source Vo1 is, for example, a highest voltage level of a system, while the voltage level of the external voltage source Vo2 is, for example, a grounding voltage level.

When the enable signal EN is disabled, the control signals SC2 and SC3 are also disabled such that the output terminal 200a is floating with respect to the external voltage sources Vo1 and Vo2 and the output terminal 200a is held in a high impedance state.

Figure 3A:
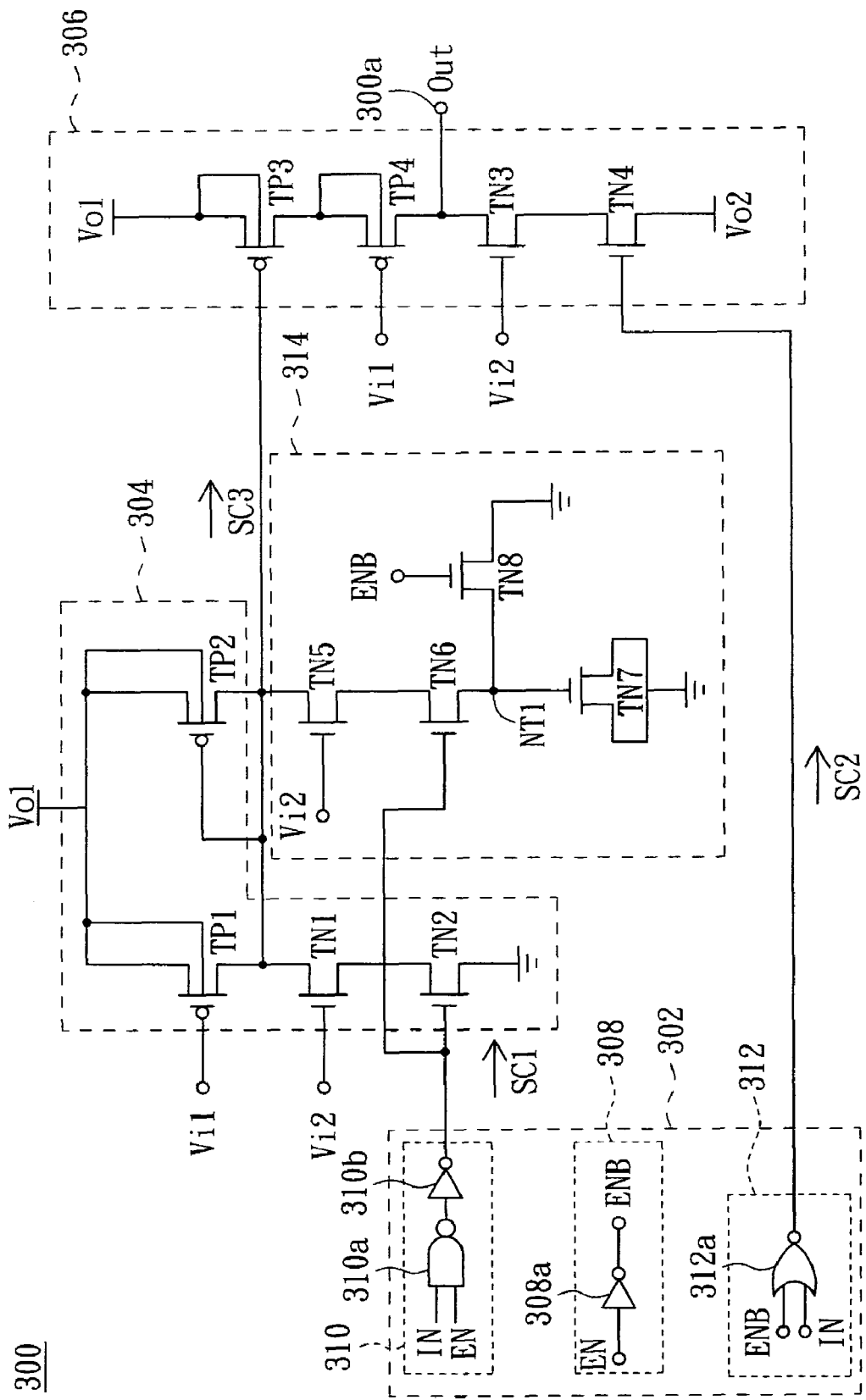
FIG. 3A is a detailed circuit diagram showing the buffer 200 of FIG. 2 according to a preferred embodiment of the invention.
Figure 3B:
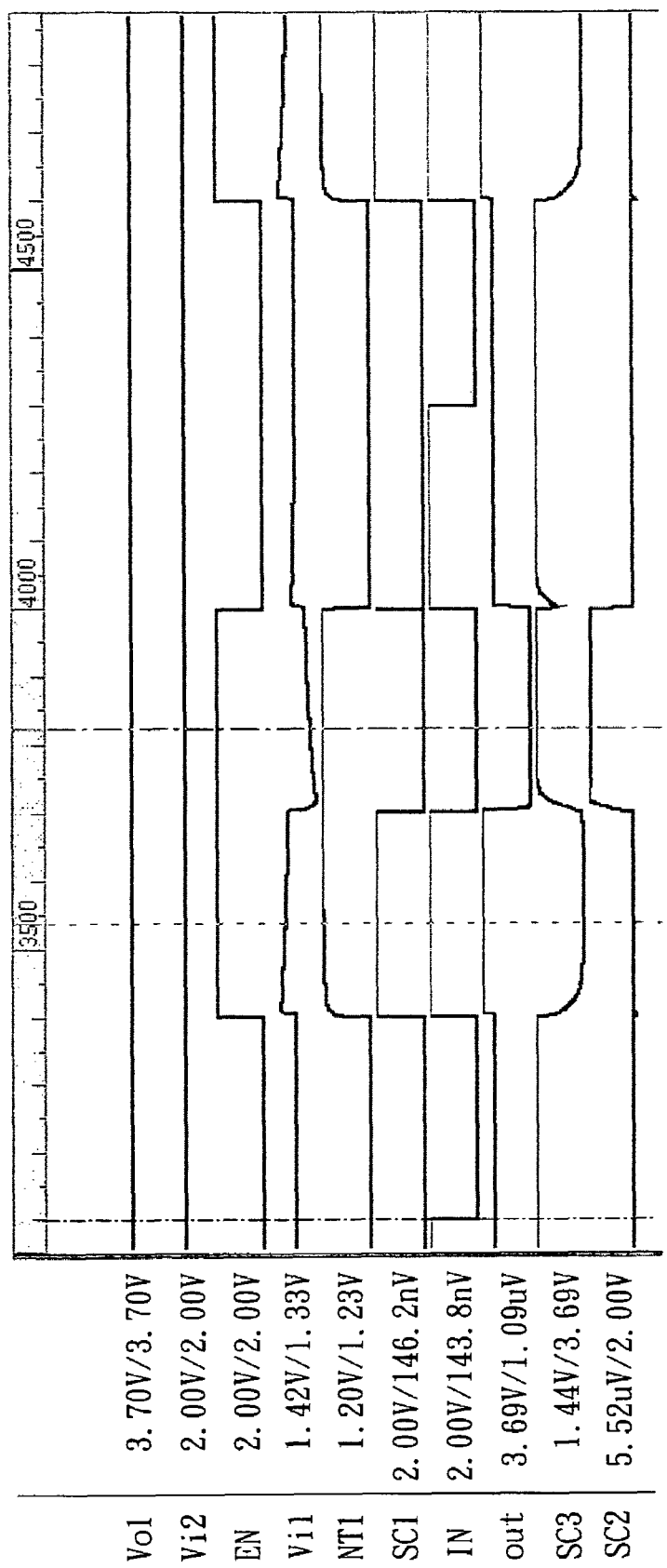
FIG. 3B is a timing chart showing associated signals of the buffer 300 of FIG. 3A.

FIG. 3A is a detailed circuit diagram showing the buffer 200 of FIG. 2 according to a preferred embodiment of the invention. FIG. 3B is a timing chart showing associated signals of the buffer 300 of FIG. 3A. In the buffer 300 of this embodiment, a biasing device 304 and a switch device 306 are implemented by the low voltage CMOS process, wherein the withstanding voltages of the included gate oxide layers of PMOS transistors and NMOS transistors are equal to 2.6 volts.

A logic unit 308 includes a NOT gate 308a for receiving the enable signal EN and performing the NOT logic operation according to the enable signal EN to generate the reverse enable signal ENB. A logic unit 310 includes a NAND gate 310a and a NOT gate 310b. The logic unit 310 receives the enable signal EN and the input signal IN at the NAND gate 310a and an output signal of the NAND gate 310a is further processed by the NOT gate 310b and then outputted. Thus, the AND logic operation according to the enable signal EN and the input signal IN may be performed to generate the control signal SC1. A logic unit 312 includes a NOR gate 312a, which receives the reverse enable signal ENB and the input signal IN and performs the NOR logic operation according to the reverse enable signal ENB and the input signal IN to generate the control signal SC2.

When the enable signal EN is enabled, the voltage levels of the control signals SC1 and SC2 are reverse to each other. When the enable signal EN is disabled, the voltage levels of the control signals SC1 and SC2 are the low levels. The enable level of the enable signal EN is, for example, a high voltage level.

The biasing device 304 includes transistors TP1, TN1 and TN2. In this method, TP1 is a PMOS transistor, and TN1 and TN2 are NMOS transistors. The transistors TP1, TN1 and TN2 are connected in series between the external voltage source Vo1 and a grounding voltage source. The drain of the transistor TP1 is coupled to the drain of the transistor TN1 to output the control signal SC3. The gates of the transistors TP1, TN1 and TN2 respectively receive internal voltages Vi1 and Vi2 and the control signal SC1, wherein the internal voltages Vi1 and Vi2 drive the transistors TP1 and TN1 to be always enabled. Consequently, the transistors TP1, TN1 and TN2 generate the control signal SC3 according to the control signal SC1, and the voltage level of the control signal SC3 may be, for example, reverse to that of the control signal SC1. The biasing device 304 further includes a transistor TP2, which is connected in parallel with the transistor TP1, for increasing the voltage level of the control signal SC3 to a voltage level approaching the external voltage source Vo1.

The switch device 306 includes transistors TP3, TP4, TN3 and TN4. The transistors TP3 and TP4 may be, for example, PMOS transistors, and the transistors TN3 and TN4 may be, for example, NMOS transistors. The transistors TP3 and TP4 are connected in series between the external voltage source Vo1 and an output terminal 300a. The gates of the transistors TP3 and TP4 respectively receive the control signal SC3 and the internal voltage Vi1, which drives the transistor TP4 to be always enabled. Consequently, the transistors TP3 and TP4 couple the output terminal 300a to the external voltage source Vo1 when the control signal SC3 has the low voltage level to make the output signal Out of the output terminal 300a be equal to the voltage level of the external voltage source Vo1. The transistors TP3 and TP4 enable the output terminal 300a to be floating with respect to the external voltage source Vo1 when the control signal SC3 has the high voltage level. The transistors TN3 and TN4 are connected in series between the external voltage source Vo2 and the output terminal. Similarly, the following conditions may be derived. The transistors TN3 and TN4 couple the output terminal 300a to the external voltage source Vo2 when the control signal SC2 has the high voltage level to make the output signal Out be equal to the voltage level of the external voltage source Vo2. The transistors TN3 and TN4 enable the output terminal 300a to be floating with respect to the external voltage source Vo2 when the control signal SC2 has the low voltage level.

Thus, when the enable signal EN is enabled and the input signal IN has the low voltage level, the control signals SC2 and SC3 respectively have the high voltage level Vo1 and the high voltage level VCC enable the transistor TN4 and disable the transistor TP3. In this embodiment, the high voltage level VCC is exemplified as 2 volts. At this time, the level of the output signal Out substantially has the low voltage level. When the enable signal EN is enabled and the input signal IN has the high voltage level, the control signals SC2 and SC3 have the low voltage level. Such that, the control signals SC2 and SC3 disable the transistor TN4 and enable the transistor TP3 respectively. At this time, the level of the output signal Out substantially has the high voltage level of Vo1. When the enable signal EN is disabled, the control signals SC2 and SC3 respectively have the low voltage level and the high voltage level when the input signal IN has either the high voltage level or the low voltage level. At this time, the control signals SC2 and SC3 respectively disable the transistors TN4 and TP3 such that the output terminal 300a is floating with respect to the external voltage source Vo2 while the output terminal 300a is floating with respect to the external voltage source Vo1. Consequently, the output terminal 300a is controlled in the high impedance state, and the buffer 300 of the embodiment is a tri-state buffer having the high impedance state.

The buffer 300 of this embodiment further includes a discharge device 314 for receiving the control signals SC1 and SC3 and discharging the control signal SC3 according to the control signal SC1. The discharge device 314 includes transistors TN5 and TN6, such as NMOS transistors, and a discharge capacitor, such as a gate oxide layer capacitor of the NMOS transistor TN7. The transistors TN5 and TN6 are connected in series between the drain of the transistor TP2 in the biasing device 304 and the node NT1. The gate and drain of the transistor TN5 respectively receive the internal voltage Vi2 and the control signal SC3. The internal voltage Vi2 continuously enables the transistor TN5. The gate of the transistor TN6 receives the control signal SC1, and the transistors TN5 and TN6 equivalently form a discharge path to generate a discharge current for discharging the control signal SC3 when the control signal SC1 is enabled.

The gate of the transistor TN7 is coupled to the node NT1, and the source and the drain of the transistor TN7 are coupled to each other to receive the grounding voltage level. Thus, the gate oxide layer capacitor of the transistor TN7 serves as the discharge capacitor coupled to the source of the transistor T2. In this manner, the discharge current for discharging the control signal SC3 charges the discharge capacitor to increase the voltage level at the node NT1. When the voltage level at the node NT1 and the voltage level of the control signal SC3 substantially approach each other, the discharge path is interrupted because the voltage levels at two ends are substantially the same. Consequently, it is possible to prevent the voltage level of the control signal SC3 from falling down to approach the grounding voltage level through the mechanism of the discharge capacitor.

The discharge device 314 further includes a transistor TN8, such as a NMOS transistor. The gate of the transistor TN8 receives the reverse enable signal ENB, and the source and the drain of the transistor TN8 are respectively coupled to the node NT1 and the grounding voltage level. Consequently, when the enable signal EN is disabled, the reverse enable signal ENB enables the transistor TN8 to discharge the charges stored in the discharge capacitor to the grounding voltage level through the transistor TN8. Thus, the discharge path including the transistors TN5 and TN6 and the discharge capacitor can operate when the enable signal EN is enabled next time.

In this embodiment, the aspect ratios of the transistors TP1, TN1 and TN2 of the biasing device 304 are configured to bias the lowest voltage level of the control signal SC1. When the control signal SC1 has the high voltage level and all the transistors TP1, TN1 and. TN2 turn on, the transistors TP1, TN1 and TN2 bias the voltage level of the control signal SC3 to the lowest voltage level. Thus, the maximum gate-source voltage of the transistor TP3 is smaller than the withstanding voltage 2.6 volts. Such that, the control signal SC3 can prevent the crossover voltage between the gate oxide layer of the transistor TP3 from being higher than the withstanding voltage 2.6 volts and being damaged. The mechanism of the discharge capacitor in this discharge device 314 prevents the voltage level of the control signal SC3 from getting too low, which makes the crossover voltage of the gate oxide layer of the transistor TP3 be higher than its withstanding voltage.

Similarly, the voltage level of the internal voltage Vi1 is a biased point that enables the transistors TP1 and TP4 and makes the gate-source voltage thereof smaller than the withstanding voltage. Thus, the transistors TP1 and TP4 can be enabled, and the problem that the crossover voltages of the oxide layers of the transistors TP1 and TP4 are higher than the withstanding voltages thereof may be avoided. The internal voltage Vi2 and the control signal SC2 also have substantially similar designs, wherein the voltage level of the internal voltage Vi2 is substantially equal to the high voltage level VCC, and the highest voltage level of the control signal SC2 is also substantially equal to the high voltage level VCC. Consequently, the gate-source voltages of the transistors TN1, TN3 and TN4 may be smaller than or equal to the high voltage level VCC, and the effects substantially similar to those of the transistors TP1, TP3 and TP4 may be obtained.

Although the gate oxide layer capacitor of the transistor TN7 serves as the discharge capacitor of the discharge device 314 in this embodiment, the discharge capacitor is not particularly limited thereto and may also have any other suitable structure. Although the circuit structures of the biasing device 304 and the switch device 306 are illustrated as an example in this embodiment, the buffer 300 of the embodiment is not particularly limited to the structure including the biasing device 304 and the switch device 306 and may have any other suitable structure of the practical circuit. Also, the logic units 308, 310 and 312 of the invention are not limited to the disclosed structures in the embodiment.

In the low voltage CMOS process tri-state buffer of the invention, a logic device is provided to receive the input signal and the enable signal, and the tri-state buffer simultaneously controls the voltage levels of the first control signal and the third control signal to be the disabled level when the enable signal has the disabled level such that the output terminal is held in a high impedance state. Consequently, the low voltage CMOS process tri-state buffer of the invention can effectively improve the problem of the lack of the high impedance state of the output terminal in the conventional low voltage CMOS process buffer, which is more power-consumptive.

In the low voltage CMOS process tri-state buffer of the invention, a discharge device is further provided to discharge the third control signal according to the first control signal. Consequently, the low voltage CMOS process tri-state buffer of the invention can shorten the voltage level falling time of the third control signal, and can effectively improve the problem that the switch device easily generates the malfunction due to the too long falling time of the third control signal in the conventional low voltage CMOS process buffer.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A low voltage CMOS (Complementary Metal Oxide Semiconductor) process tri-state buffer applied to a low voltage CMOS process integrated circuit, the tri-state buffer receiving an enable signal and having an output terminal, the output terminal being held in a high impedance state when the enable signal is disabled, the tri-state buffer comprising:

a logic device configured to receive an input signal and the enable signal, and generate a first control signal and a second control signal according to the input signal and the enable signal, the logic device including:
a first logic unit configured to receiving the enable signal and perform a NOT logic operation according to the enable signal to generate a reverse enable signal;
a second logic unit for receiving the input signal and the enable signal and performing an AND logic operation according to the input signal and the enable signal to generate the first control signal; and
a third logic unit configured to receive the input signal and the reverse enable signal and perform a NOR logic operation according to the input signal and the reverse enable signal to generate the second control signal;

a biasing device configured to receive the first control signal, control a voltage level of a third control signal according to the first control signal, and output the third control signal;

a switch device configured to receive the second control signal and the third control signal and coupling the output terminal to a first external voltage source and a second external voltage source when the second control signal and the third control signal are enabled, thereby to make a voltage level of the output terminal equal to a voltage level of the first external voltage source and a voltage level of the second external voltage source, respectively; and a discharge device configured to receive the first control signal and the third control signal and discharge the third control signal according to the first control signal, thereby to shorten a voltage level falling time of the third control signal, wherein when the enable signal is disabled, the second control signal and the third control signal are disabled to make the output terminal float with respect to the first external voltage source and the second external voltage source and to hold the output terminal in a high impedance state.

2. The tri-state buffer according to claim 1, wherein the discharge device comprises:

a first NMOS (N-channel Metal Oxide Semiconductor) transistor having a drain for receiving the third control signal and a gate for receiving a first internal voltage, and the first internal voltage continuously enables the first NMOS transistor;

a second NMOS transistor having a drain coupled to a source of the first NMOS transistor and a gate for receiving the first control signal, wherein the second NMOS transistor and the first NMOS transistor form a discharge path according to the first control signal to discharge the third control signal; and a discharge capacitor having one end coupled to a source of the second NMOS transistor and the other end for receiving a grounding voltage level, wherein the discharge capacitor interrupts the discharge path when the discharge path discharges the third control signal to approach a constant voltage level so as to prevent the voltage level of the third control signal from being discharged to approach the grounding voltage level through the discharge path.

3. The tri-state buffer according to claim 2, wherein the discharge capacitor is a gate oxide layer capacitor of a third NMOS transistor, the third NMOS transistor has a source, a drain, which is coupled to the source of the third NMOS transistor and receives the grounding voltage level, and a gate coupled to the source of the second NMOS transistor.

4. The tri-state buffer according to claim 2, wherein the discharge device further comprises:

a fourth NMOS transistor having a drain coupled to the source of the second NMOS transistor, a source for receiving the grounding voltage level, and a gate for receiving the reverse enable signal, wherein when the enable signal is disabled, the reverse enable signal enables the fourth NMOS transistor, through which charges stored in the discharge capacitor are discharged to the grounding voltage level.

5. A low voltage CMOS (Complementary Metal Oxide Semiconductor) process tri-state buffer applied to a low voltage CMOS process integrated circuit, the tri-state buffer receiving an enable signal and having an output terminal, the output terminal being held in a high impedance state when the enable signal is disabled, the tri-state buffer comprising:

a logic device configured to receive an input signal and the enable signal, and generate a first control signal and a second control signal according to the input signal and the enable signal, the logic device including:

a first logic unit configured to receiving the enable signal and perform a NOT logic operation according to the enable signal to generate a reverse enable signal;

a second logic unit for receiving the input signal and the enable signal and performing an AND logic operation according to the input signal and the enable signal to generate the first control signal; and a third logic unit configured to receive the input signal and the reverse enable signal and perform a NOR logic operation according to the input signal and the reverse enable signal to generate the second control signal;

a biasing device configured to receive the first control signal, control a voltage level of a third control signal according to the first control signal, and output the third control signal;

a switch device configured to receive the second control signal and the third control signal and coupling the output terminal to a first external voltage source and a second external voltage source when the second control signal and the third control signal are enabled, thereby to make a voltage level of the output terminal equal to a voltage level of the first external voltage source and a voltage level of the second external voltage source, respectively, wherein:

when the enable signal is disabled, the second control signal and the third control signal are disabled to make the output terminal be floating with respect to the first external voltage source and the second external voltage source and to hold the output terminal in a high impedance state, the switch device comprises a first PMOS (P-channel Metal Oxide Semiconductor) transistor and a second PMOS transistor, gates of the first PMOS transistor and the second PMOS transistor respectively receive the third control signal and a second internal voltage, which continuously enables the second PMOS transistor, sources and drains of the first PMOS transistor and the second PMOS transistor are connected in series between the first external voltage source and the output terminal, and the first PMOS transistor and the second PMOS transistor couple the first external voltage source to the output terminal according to the third control signal.

6. The tri-state buffer according to claim 5, wherein the biasing device controls a voltage level of the third control signal to make a crossover voltage of a gate oxide layer of the first PMOS transistor be smaller than a withstanding voltage of the gate oxide layer of the first PMOS transistor.

7. A low voltage CMOS (Complementary Metal Oxide Semiconductor) process tri-state buffer applied to a low voltage CMOS process integrated circuit, the tri-state buffer receiving an enable signal and having an output terminal, the output terminal being held in a high impedance state when the enable signal is disabled, the tri-state buffer comprising:

a logic device configured to receive an input signal and the enable signal, and generate a first control signal and a second control signal according to the input signal and the enable signal, the logic device including:

a first logic unit configured to receiving the enable signal and perform a NOT logic operation according to the enable signal to generate a reverse enable signal;

a second logic unit for receiving the input signal and the enable signal and performing an AND logic operation according to the input signal and the enable signal to generate the first control signal; and a third logic unit configured to receive the input signal and the reverse enable signal and perform a NOR logic operation according to the input signal and the reverse enable signal to generate the second control signal;

a biasing device configured to receive the first control signal, control a voltage level of a third control signal according to the first control signal, and output the third control signal;

a switch device configured to receive the second control signal and the third control signal and coupling the output terminal to a first external voltage source and a second external voltage source when the second control signal and the third control signal are enabled, thereby to make a voltage level of the output terminal equal to a voltage level of the first external voltage source and a voltage level of the second external voltage source, respectively, wherein:

when the enable signal is disabled, the second control signal and the third control signal are disabled to make the output terminal be floating with respect to the first external voltage source and the second external voltage source and to hold the output terminal in a high impedance state, the switch device comprises a fifth NMOS transistor and a sixth NMOS transistor, gates of the fifth NMOS transistor and the sixth NMOS transistor respectively receive the second control signal and a first internal voltage, which continuously enables the sixth NMOS transistor, sources and drains of the fifth NMOS transistor and the sixth NMOS transistor are connected in series between the second external voltage source and the output terminal, and the fifth NMOS transistor and the sixth NMOS transistor couple the second external voltage source to the output terminal according to the second control signal.

8. The tri-state buffer according to claim 7, wherein the third logic unit further controls a voltage level of the second control signal to make a crossover voltage of a gate oxide layer of the fifth NMOS transistor be smaller than a withstanding voltage of the gate oxide layer of the fifth NMOS transistor.

9. The tri-state buffer according to claim 7, wherein the biasing device comprises:

a third PMOS transistor having a source coupled to the first external voltage source, a drain for receiving the third control signal, and a gate for receiving a second internal voltage, which continuously enables the third PMOS transistor, the third PMOS transistor continuously biasing a voltage level of the third control signal to be the voltage level of the first external voltage source;

a fourth PMOS transistor having a source coupled to the first external voltage source, and a drain and a gate both coupled to the drain of the third PMOS transistor to receive the third control signal, the fourth PMOS transistor biasing the voltage level of the third control signal to be the voltage level of the first external voltage source according to the third control signal;

a seventh NMOS transistor and an eighth NMOS transistor, wherein:

gates of the seventh NMOS transistor and the eighth NMOS transistor respectively receive the first control signal and the first internal voltage, which continuously enables the seventh NMOS transistor;

sources and drains of the seventh NMOS transistor and the eighth NMOS transistor are connected in series between the drain of the third PMOS transistor and a grounding voltage level; and the third PMOS transistor, the seventh NMOS transistor and the eighth NMOS transistor bias the voltage level of the third control signal according to the first control signal to make a crossover voltage of an oxide layer of the first PMOS transistor be smaller than a withstanding voltage of the oxide layer of the first PMOS transistor.

* * * * *